United States Patent
Cohen et al.

(10) Patent No.: US 6,667,528 B2
(45) Date of Patent: Dec. 23, 2003

(54) SEMICONDUCTOR-ON-INSULATOR LATERAL P-I-N PHOTODETECTOR WITH A REFLECTING MIRROR AND BACKSIDE CONTACT AND METHOD FOR FORMING THE SAME

(75) Inventors: Guy Moshe Cohen, Mohegan Lake, NY (US); Kern Rim, Yorktown Heights, NY (US); Dennis L. Rogers, Croton-on-Hudson, NY (US); Jeremy Daniel Schaub, Yonkers, NY (US); Min Yang, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/033,902

(22) Filed: Jan. 3, 2002

(65) Prior Publication Data

US 2003/0122210 A1 Jul. 3, 2003

(51) Int. Cl.⁷ .......................................... H01L 31/058
(52) U.S. Cl. .................. 257/469; 257/347; 257/432; 257/436; 257/446; 257/447; 257/448; 257/458; 257/459; 257/460; 257/461; 257/462; 257/463; 257/464; 257/465; 257/469; 438/48; 438/87; 438/309
(58) Field of Search ................. 257/469, 458, 257/459, 460, 461, 462, 463, 464, 465, 347, 432, 446, 447, 448, 436; 438/48, 87, 309

(56) References Cited

U.S. PATENT DOCUMENTS

| | | | | |
|---|---|---|---|---|
| 4,814,847 A | * | 3/1989 | Tabatabaie | 357/30 |
| 4,829,013 A | * | 5/1989 | Yamazaki | 437/2 |
| 5,600,130 A | * | 2/1997 | Van Zeghbroeck | 250/14.1 |
| 5,818,066 A | * | 10/1998 | Duboz | 257/21 |
| 5,973,260 A | * | 10/1999 | Tange et al. | 136/256 |
| 6,107,643 A | * | 8/2000 | Skytt et al. | 257/77 |
| 6,177,289 B1 | | 1/2001 | Crow et al. | |
| 6,388,301 B1 | * | 5/2002 | Tawada et al. | 257/436 |
| 6,404,031 B1 | * | 6/2002 | Hane et al. | 257/466 |
| 6,429,463 B1 | * | 8/2002 | Mauk | 257/98 |
| 6,451,702 B1 | | 9/2002 | Yang et al. | |
| 6,486,522 B1 | * | 11/2002 | Bishay et al. | 257/444 |

OTHER PUBLICATIONS

U.S. patent application No. 09/929,182, YOR9–2001–0215, "A Method for Increasing the Capacitance of a Trench Capacitor", pp. 1–24, and Figs. 1A–5.
U.S. patent application No. 09/784,963, YOR9–2000–0839US1, "Methods For Forming Lateral Trench Optical Detectors", pp. 1–21, and Figs. 1–13.
U.S. patent application No. 09/678,315, YOR92000–0052, "Silicon–On–Insulator (SOI) Trench Photodiode and Method of Forming Same", pp. 1–18, and Figs. 1A–8C.
B.F. Levine, J.D. Wynn, F.P. Klemens, and G. Sarusi, "1 Gb/s Si high quantum efficiency monolithically integrable lambda=0.88 um detector", Appl. Phys. Lett. 66 (22), p. 2984–2986, (1995).
E. Chen et al., "High–efficiency and high speed silicon metal–semiconductor–metal photodetector operating in the infrared", Appl. Phys. Lett., 70(6), p. 753–755, (1997).
Emsley et al., "High–Speed Resonant–Cavity Enhanced Silicon Photodetectors on Reflecting Silicon–On–Insulator Substrates", IEEE Photonics Technology Letters, vol. 14, No. 4, Apr. 2002, pp. 519–521.

* cited by examiner

*Primary Examiner*—Jerome Jackson
*Assistant Examiner*—Edgardo Ortiz
(74) *Attorney, Agent, or Firm*—Thu Ann Dang, Esq.; McGinn & Gibb, PLLC

(57) ABSTRACT

A photodetector (and method for producing the same) includes a semiconductor substrate, a buried insulator formed on the substrate, a buried mirror formed on the buried insulator, a semiconductor-on-insulator (SOI) layer formed on the conductor, alternating n-type and p-type doped fingers formed in the semiconductor-on-insulator layer, and a backside contact to one of the p-type doped fingers and the n-type doped fingers.

43 Claims, 15 Drawing Sheets

SEMICONDUCTOR-ON-INSULATOR LATERAL P-I-N PHOTODETECTOR WITH A REFLECTING MIRROR AND BACKSIDE CONTACT AND METHOD FOR FORMING THE SAME

BACKGROUND OF THE INVENTION

1. Field of the Invention

The present invention generally relates to a photodetector for optical communication and to a method of forming a p-i-n photodiode in a semiconductor.

2. Description of the Related Art

A p-i-n diode includes an intrinsic semiconductor layer (i.e., the i-region) that is sandwiched between p-type doped and n-type doped semiconductor layers. The low doping level in the intrinsic region causes this region to be depleted of carriers at low bias. When a reverse bias is applied to the p-i-n diode, most of the high electric field will develop in the intrinsic region.

When light is absorbed in the semiconductor, it produces electron-hole pairs. The high electric field serves to separate these carriers. Electrons are swept to the n-type region, where holes are swept to the p-type region. The photogenerated electrons and holes lead to current flow in the external circuit. This current is referred to as the "photogenerated current", or photo-current.

For high speed operation, the intrinsic region is kept relatively thin (e.g., within a range of about 0.1 µm to about 2 µm) to reduce the transit time of the photogenerated carriers. For high quantum efficiency (e.g., defined as the number of electron-hole pairs generated per incident photons), the intrinsic region must be relatively thick so that most of the incident light would be absorbed (e.g., see S. M. Sze, Physics of Semiconductor Devices, 2nd Ed., Wiley New-York, 1981).

However, these two opposite requirements are more difficult to meet when the p-i-n photodiode is produced with an indirect bandgap material, where the absorption length is very large. "Absorption length" is the length at which about 63% of the incident photons are absorbed. Thus, the absorption length is the typical length in which most (e.g., a predetermined high number) of the photons are absorbed. Such photons must be absorbed to become carriers. Generally, the thicker the material, the more absorption will occur. Hence, an absorption length/volume is required in which the photons can interact with a material (e.g., silicon in the case at hand) to be converted into carriers, which are in turn swept to electrodes (e.g., formed of doped polysilicon or the like).

An example of such an indirect bandgap semiconductor is silicon (Si), for which the absorption length is relatively large (e.g., about 15 to 20 microns for 850 nm light radiation) (e.g., see David F. Edwards, "Silicon (Si)," in Handbook of Optical Constants of Solids, ed. by Edward D. Palik, Academic Press, pp.547–568, (1985), and Geist, "Silicon Revisited (1.1–3.1 eV)," in Handbook of Optical Constants of Solids III, ed. by Edward D. Palik, Academic Press, p. 529, (1998)).

As a comparison with the indirect bandgap material, the absorption length is about 1 micron for a direct bandgap material such as GaAs (e.g., see Edward D. Palik, "Gallium Arsenide (GaAs)" in Handbook of Optical Constants of Solids, ed. by Edward D. Palik, Academic Press, pp. 429–443, (1985)). Thus, a conventional silicon p-i-n photodiode is expected to have low speed operation or to exhibit low quantum efficiency at 850 nm.

Recently, a new p-i-n structure that decouples the absorption length from the photogenerated carrier transit time was proposed and experimentally tested (e.g., see U.S. Pat. No. 6,177,289, to J. Crow et. al, entitled "Lateral trench optical detector"). The structure includes alternating p-type and n-type parallel trenches separated by an intrinsic semiconductor. The structure forms a lateral p-i-n detector as illustrated in FIG. 1.

In the structure of FIG. 1, the photogenerated carriers only need to travel the short distance between two adjacent trenches before they are collected by the p-type and n-type plates. For this reason, the useful region for photon absorption is set by the depth of the trenches. Therefore, the trench depth should be comparable to the absorption length of the light in the semiconductor.

A monolithic integration of the p-i-n detector with the optical receiver electronics is very desirable since it can improve performance and reliability and reduce packaging costs. Since the receiver is fully realized by silicon technology, the photodetector must be made of silicon. Given that the absorption length in silicon is about 15 to 20 microns for 850 nm light radiation, to achieve high quantum efficiency trenches of comparable depth would have to be etched. Additionally, the trenches should be made as narrow as possible and take as little as possible of the surface real-estate, so that most of the detector surface is available for light absorption. However, these requirements impose the following problems.

First, most known etching processes can only yield a finite aspect ratio between the trench depth and width. For example, a high aspect ratio of 40:1 and a trench width of 0.2 microns yields a trench depth of about 8 microns. For silicon, this would be only about half of the required trench depth.

Even if the trench can be made deep enough, it may be difficult to fill with the conductor material. Most methods used in silicon manufacturing would form a seam in an attempt to fill the trench.

The deeper and narrower the trench is, the higher the series resistance it would have. This may affect the detector performance and result in a large RC time, where R is the trench series resistance and C is the device capacitance.

If the trenches are made shorter than the absorption length, then photons that are absorbed below the trench bottom generate carriers that drift slowly by following the weak fringing field between the n-type and p-type plates and eventually are collected by the plates. The weak field and the large diffusion length of carriers in silicon (about 80 microns) slow the detector response.

To eliminate carriers that are absorbed below the trench bottom line, an SOI trench photodetector was proposed (e.g., see U.S. patent application Ser. No. 09/678,315, to H. Kwark et. al, entitled "Silicon-on-insulator trench photodiode structure for improved speed and differential isolation," having IBM docket number YOR920000052US1, and incorporated herein by reference).

The detector trenches are etched in a silicon layer that lays on an insulator film, as illustrated in FIG. 2. Photons that are absorbed below the insulator film are blocked by the insulator film and are not collected by the photodetector n-type and p-type plates.

However, the detector quantum efficiency is expected to be lower due to the loss of photons that are absorbed below the insulating film. Thus, the conventional structure of FIG. 2 is problematic as well.

Thus, in the above-described conventional methods and structures, some of the carriers are absorbed by the 8-micron electrodes (e.g., shown in FIG. 1) to produce a pulse, but other carriers are absorbed way beneath the 8-micron electrodes (e.g., shown in FIG. 1) in the substrate 1. As a result, these "deep" carriers slowly drift to the electrodes to produce a pulse with a relatively long, long "tail". This is problematic.

That is, ideally if a short light pulse is flashed, then the response of the photodetector is likewise a short current pulse corresponding to the short light pulse of the light source. However, as mentioned above, in the above situation where the carriers are drifting slowly toward the electrode from the substrate, such carriers produce the pulse with the long, long "tail". Ideally, the pulse of current should correspond to/replicate as closely as possible the shape of the light pulse. The structure of FIG. 1 does not achieve such a replication.

Thus, the structure of FIG. 2 has been formed to have an insulator 2 to block the carriers which are absorbed deep in the silicon substrate 1, from slowly drifting up to the electrodes and there by prevent these carriers from contributing to the current being produced. However, this structure of FIG. 2 is problematic in its resistance, capacitance, as well as its efficiency, as described above.

SUMMARY OF THE INVENTION

In view of the foregoing and other problems, drawbacks, and disadvantages of the conventional methods and structures, an object of the present invention is to provide a new trench photodiode structure that is applicable to optical communication and is fully compatible with silicon processing.

Another object is to provide such a structure having a reduced junction capacitance and lower series resistance, exhibits a higher quantum efficiency, and allows efficient coupling of an optical fiber.

Yet another object of the present invention is to provide a method for the fabrication of the above trench photodiode.

In a first aspect of the present invention, a photodetector (and method for producing the same) includes a semiconductor substrate, a buried insulator formed on the substrate, a buried mirror formed on the buried insulator, a semiconductor-on-insulator (SOI) layer formed on the conductor, alternating n-type and p-type doped fingers formed in the semiconductor-on-insulator layer, and a backside contact to either one of the p-type doped fingers or the n-type doped fingers.

In a second aspect of the present invention, a photodetector (and method for producing the same) includes a semiconductor substrate, a buried insulator formed on the semiconductor substrate, a semiconductor-on-insulator (SOI) layer formed on the substrate, alternating n-type and p-type doped fingers formed in the SOI layer, a top mirror formed above the SOI layer, and a via formed in the semiconductor substrate for backside illumination, and for fiber alignment.

In a third aspect of the present invention, a method of forming a photo-detector, includes forming a buried insulator on a semiconductor substrate, forming a semiconductor-on-insulator (SOI) layer on the substrate, forming alternating n-type and p-type doped fingers in the SOI layer, forming a top mirror above the SOI layer, and forming a via in the semiconductor substrate for backside illumination, and for providing a fiber alignment cone.

In a fourth aspect of the present invention, a method of forming a photodetector having a fiber alignment cone, includes forming a semiconductor-on-insulator (SOI) layer over a substrate, forming alternating first-type and second-type trenches in the SOI layer, siliciding portions of the trenches, forming an insulator over the SOI layer, forming a mirror over the insulator, and etching a cavity in the substrate for receiving a fiber for backside illumination.

In a fifth aspect of the present invention, a complementary metal oxide (CMOS) chip, includes a semiconductor chip substrate, and a photodetector as described above, formed on the substrate.

With the unique and unobvious aspects of the present invention, a new trench photodiode structure (and method of forming the same) is provided which is applicable to light wavelength communication, and is fully compatible with silicon processing. The inventive structure has a reduced junction capacitance and lower series resistance, exhibits a higher quantum efficiency, and allows an efficient coupling of a fiber.

BRIEF DESCRIPTION OF THE DRAWINGS

The foregoing and other purposes, aspects and advantages will be better understood from the following detailed description of preferred embodiments of the invention with reference to the drawings, in which:

FIGS. 7A–8D illustrate processing steps of the method according to a preferred embodiment of the present invention in which:

FIGS. 7A–7K illustrate main processing steps for making the structure shown in FIG. 3B; and FIGS. 8A–8D illustrate main processing steps for fabricating the structure shown in FIG. 3C;

DETAILED DESCRIPTION OF PREFERRED EMBODIMENTS OF THE INVENTION

Figure 1:
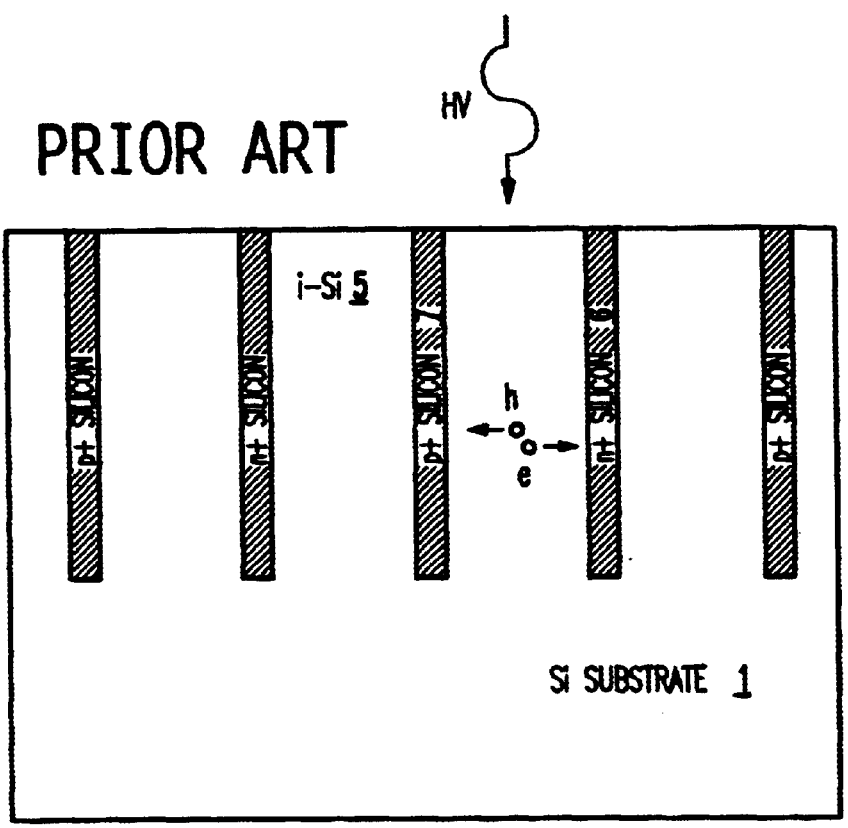
FIG. 1 illustrates a photo-generated carrier collection in a conventional trench detector.

Referring now to the drawings, and more particularly to FIGS. 3A–12, there are shown preferred embodiments of the method and structures according to the present invention.

Preferred Embodiment

Figure 3B:
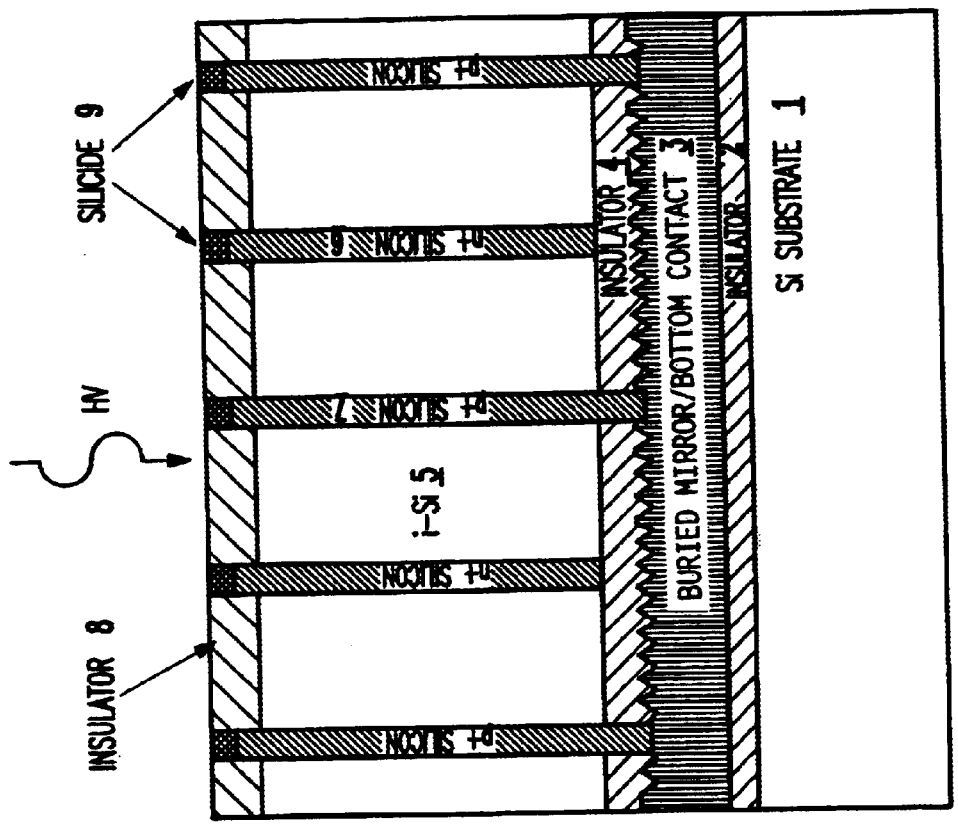
FIG. 3B illustrates a SOI trench detector with a corrugated buried mirror, and a backside contact according to the present invention.
Figure 3A:
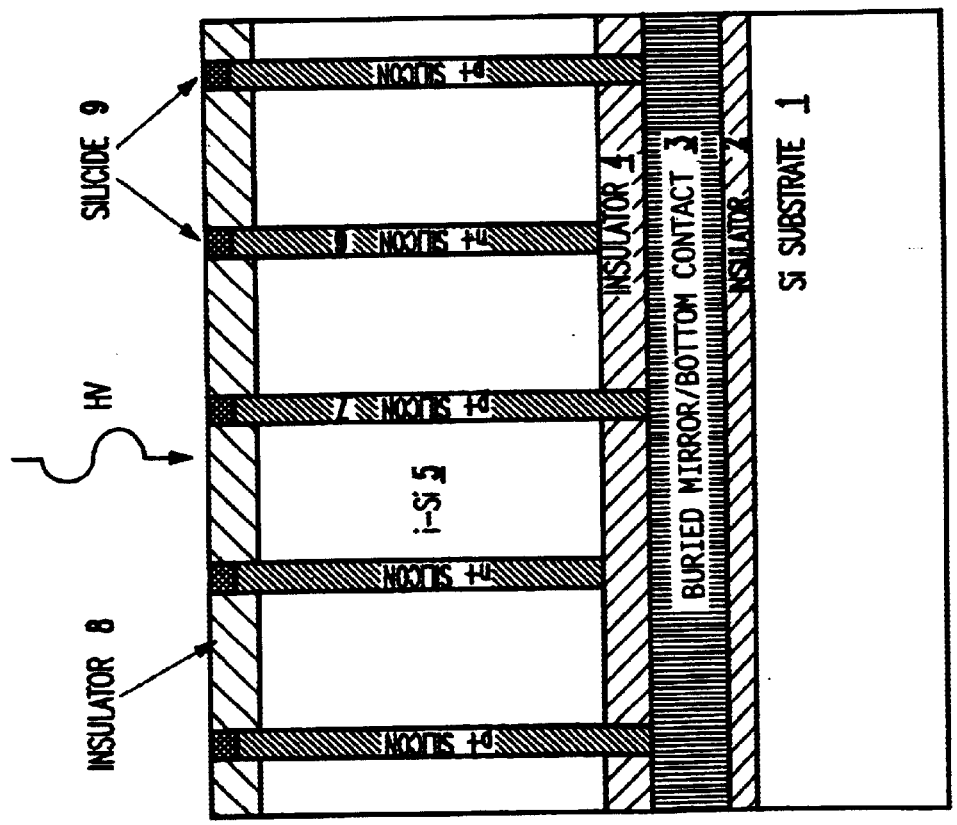
FIG. 3A illustrates a SOI trench detector with a buried mirror, and a backside contact according to the present invention.

FIG. 3A illustrates a cross section of a structure according to the present invention which includes a silicon substrate 1, a first insulator layer 2 such as oxide, a conductor film 3 such as tungsten (or other metals such as refractory metals that withstand the bonding anneal) or heavily doped poly-Si, a second insulator film 4, an intrinsic silicon-on-insulator layer 5, and alternating n-type 6 and p-type 7 filled trenches.

The contacts to the n-type trenches 6 are made on the top surface, whereas contacts to the p-type trenches 7 are made to the top and to the bottom of each trench 7.

Figure 2:
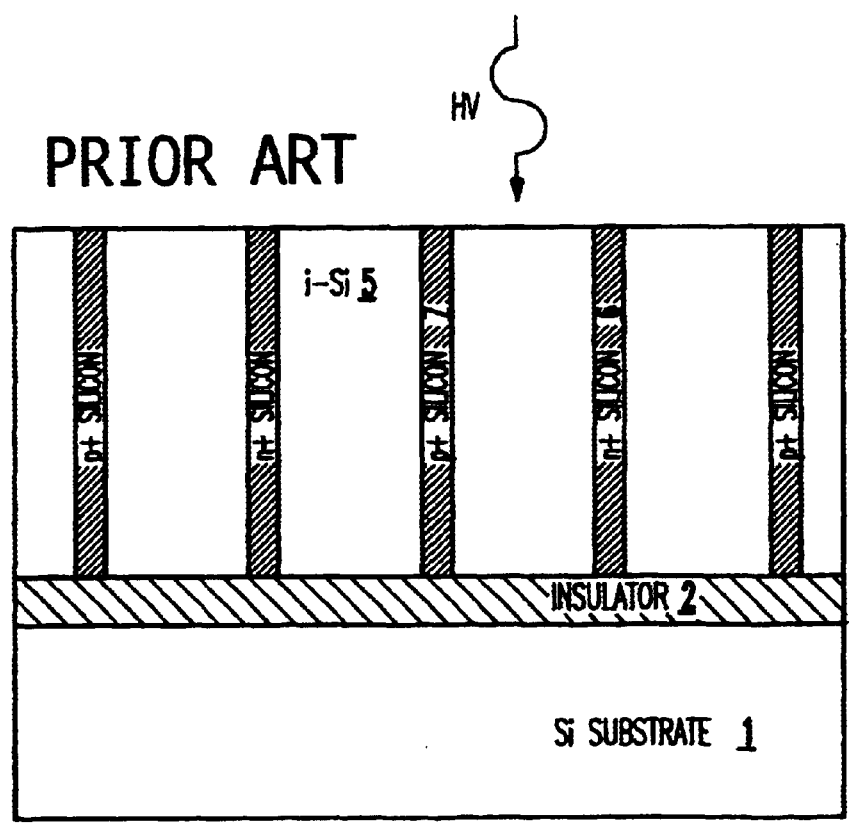
FIG. 2 illustrates a conventional Semiconductor-on-insulator (SOI) trench photodetector.
Figure 4:
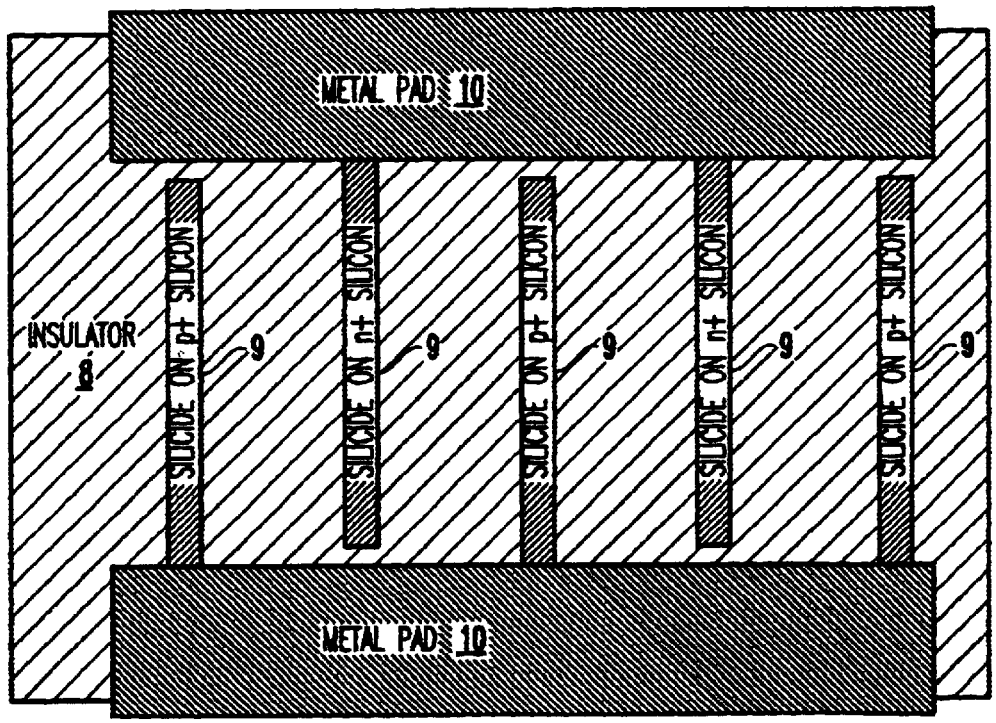
FIG. 4 illustrates a layout (top view) of the SOI trench detector of FIGS. 3A–3B and 3D according to the present invention.

A top view of the detector layout is shown in FIG. 4. The top portion of each trench is converted into silicide 9, such as CoSi$_2$, to minimize the series resistance from the metal pad 10 to the trench. Such a structure has several advantages over the conventional structures described above and shown in FIGS. 1 and 2.

For example, a sandwich structure, formed by the insulator 4—conductor 3—insulator 2 layers, forms a back mirror. Thus, if a light is shone from the top, then, at the very least (e.g., in a worst case), the photon(s) will travel from the top to the bottom and if for any reason any of the photon(s) are not absorbed, such photons will reach the "mirror" and will be reflected back. Thus, the photons now will have twice the path.

Hence, for example, if the electrode fingers are 8 μm in length, the effective path distance will be 16 μm, which essentially is within the absorption length (e.g., 15–20 μm as mentioned above) of silicon. By the same token, if 8 μm length is satisfactory, then the detector's fingers can be shortened to 4 μm, thereby reducing in half a capacitance of the fingers since an area of the fingers is being reduced in half. Thus, in the exemplary case, at least a factor of two can be gained in speed (and an even greater factor as described below).

Thus, the thicknesses of these layers 2, 3, and 4 can be tuned to produce a high reflectivity at the wavelength of interest. A metallic conductor film would produce a near perfect reflection. The insulator 8—air interface would form a top mirror for the photons reflected by the bottom mirror. Therefore, the light can make multiple passes through the absorption region 5, thereby increasing the effective light detection length.

Figure 9:
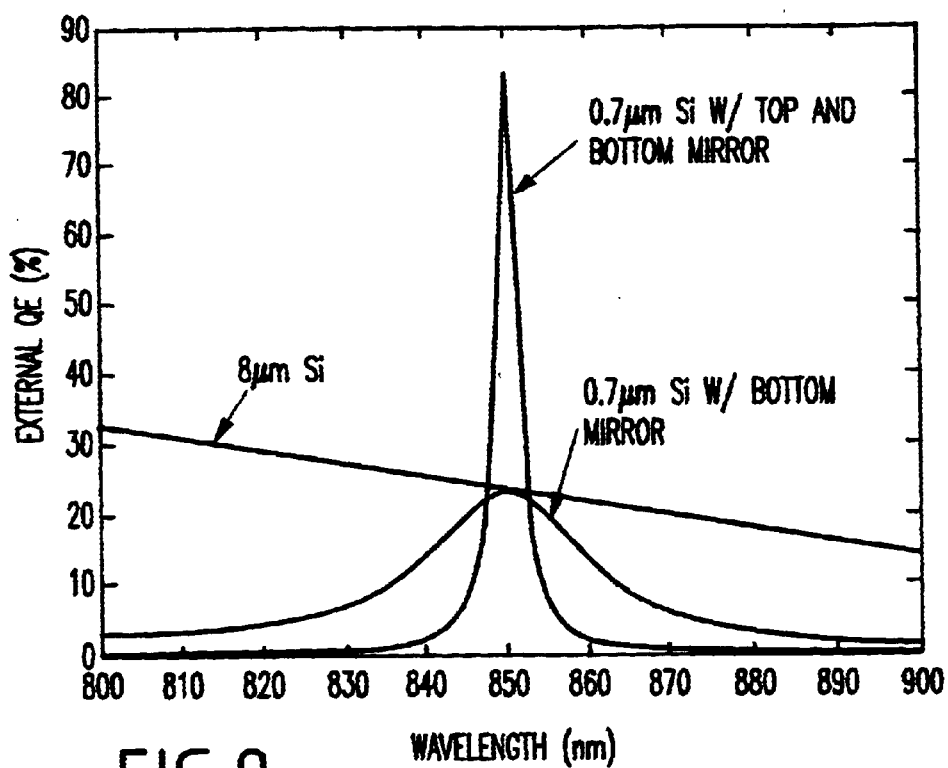
FIG. 9 illustrates simulated quantum efficiency versus the radiation wavelength for a bulk silicon detector, a detector incorporating a buried mirror, and a detector with a top and buried mirror.

Thus, the inventive structure can be made with a much shallower absorbing region while simultaneously maintaining a given quantum efficiency at a specific wavelength. This effect is shown in FIG. 9.

That is, the calculated quantum efficiency of an 8 μm thick Si layer is 23% at a wavelength of 850 nm. If a bottom mirror is incorporated into the inventive structure as shown in FIG. 3A, then only 0.7 μm of Si is required to produce the same quantum efficiency. Thus, both the parallel plate capacitance and the series resistance of the device would be reduced by a factor of 11.4. Even better, incorporating a top mirror into the structure, as shown in FIG. 9 would theoretically increase the efficiency to greater than 80%.

Another advantage is that the conductor layer 3 forms a back contact to the p-type trenches 7. As shown, the n-type silicon fingers and p-type silicon fingers have alternating lengths, with the p-type silicon fingers having a longer length. Hence, in such a case, every p-type silicon has not only a top contact but also a bottom contact. This reduces the parasitic series resistance associated with a deep and narrow trench by another factor of two (e.g., since RC time= capacitance×resistance). Thus, combining the reduction obtained by making the trench shallower, the resistance is reduced by a factor of 22.8. This reduction in resistivity is especially important for p-type silicon which is more resistive than n-type silicon due to the difference in the carrier mobility.

As known, resistivity in a semiconductor is basically a function of the carrier mobility (i.e., mobility is the proportionality constant between the electric field and the carrier velocity at low field). Typically, in p-type silicon, the mobility is 3 times lower than in n-type silicon (and hence is more resistive than n-type silicon). Thus, the invention aims at reducing resistance by a factor of two by using the p-type fingers which have a bottom contact with the conductor layer 3. By the same token, it is noted that the n-type silicon could be contacted to the conductor 3 instead of the p-type silicon. However, in the case of silicon, the benefits would not be as great as using the p-type silicon to contact the conductor.

The overall reduction obtain in the detector RC time is a factor of 260, due to reduction of the capacitance by 11.4 and reduction of the series resistance by 22.8.

Figure 10:
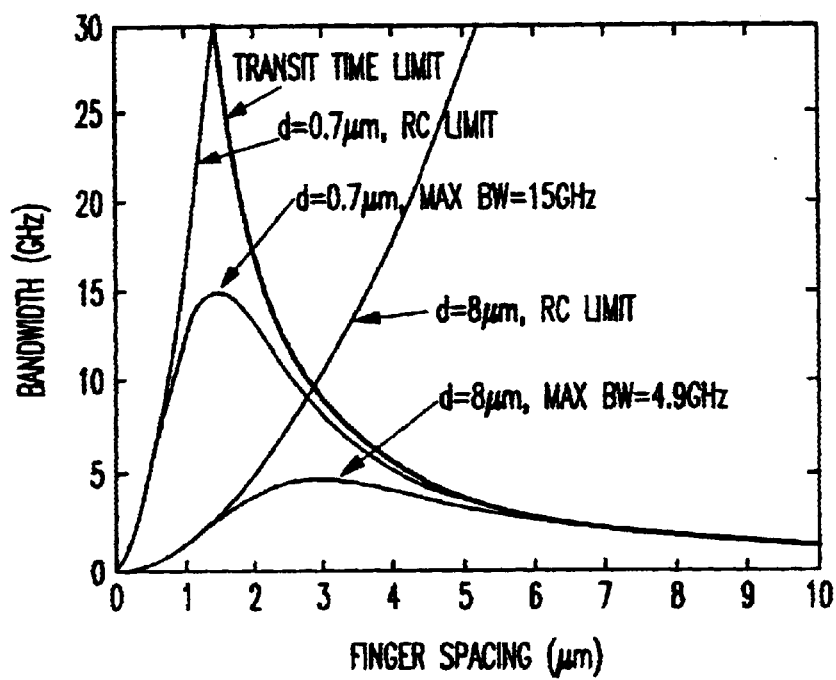
FIG. 10 illustrates the calculated detector bandwidth as a function of the finger spacing for 8 μm and 0.7 μm deep trenches.

When optimizing the detector structure, a reduction in the RC time leads to a smaller finger spacing, as illustrated in FIG. 10, which shows the calculated detector bandwidth as a function of the finger spacing for 8 μm and 0.7 μm deep trenches. The bandwidth increases by more than a factor of three, when the trench depth is shortened from 8 μm to 0.7 μm. The increase is obtained due to several factors including lower transient time due to smaller finger spacing, and higher drift velocity due to higher electric field for a constant operation voltage. The calculation takes into account the saturation in the carriers velocity in high electric fields.

Figure 11:
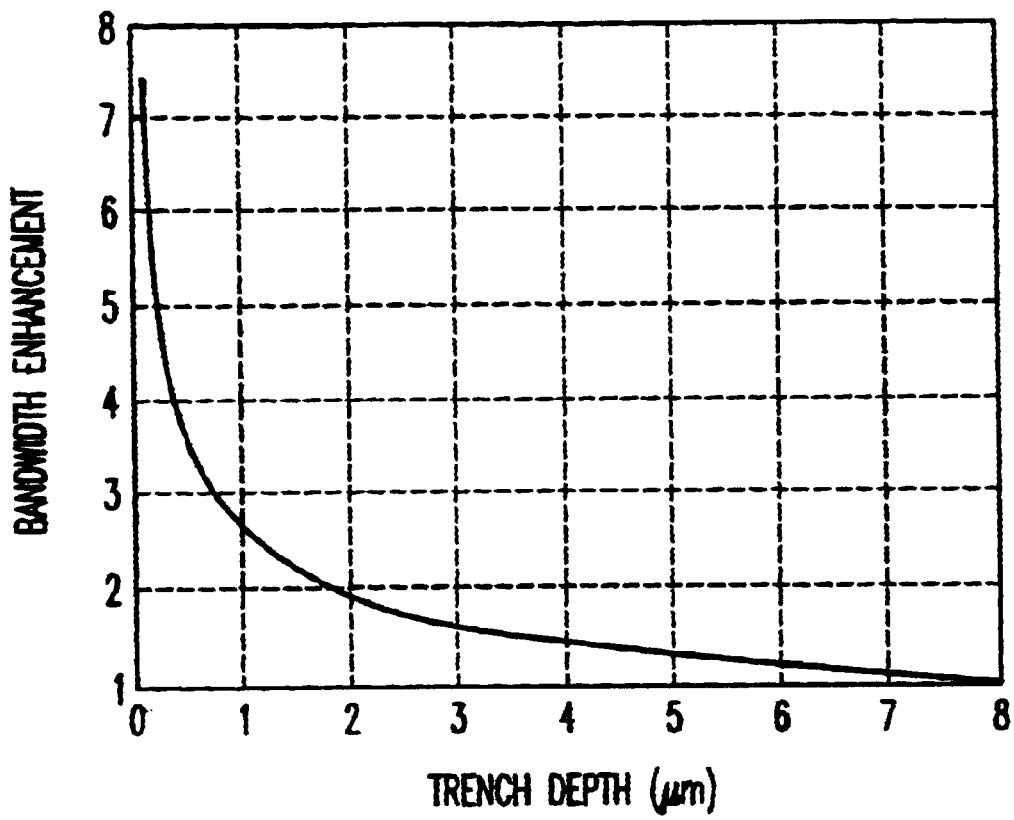
FIG. 11 illustrates the calculated bandwidth enhancement over a detector with 8 μm deep trenches versus the trench depth.

FIG. 11 is a plot showing the bandwidth as a function of the trench depth. FIG. 11 illustrates the advantage obtained by using a thinner SOI film. By incorporating a backside mirror and a backside contact, the present invention opens the way for use of thinner SOI films.

It is noted that the conductor layer 3 may add a parasitic capacitance to the photodiode due to coupling of the conductor film to the n-type trenches. This capacitance is typically small (e.g., less than 5%) due to the plates being perpendicular to the conductor film and due to the low dielectric constant of the insulator as compared to that of silicon. This small capacitance can easily be further reduced to the point where it can be ignored by thickening the insulator film 4.

Second Embodiment

Figure 3C:
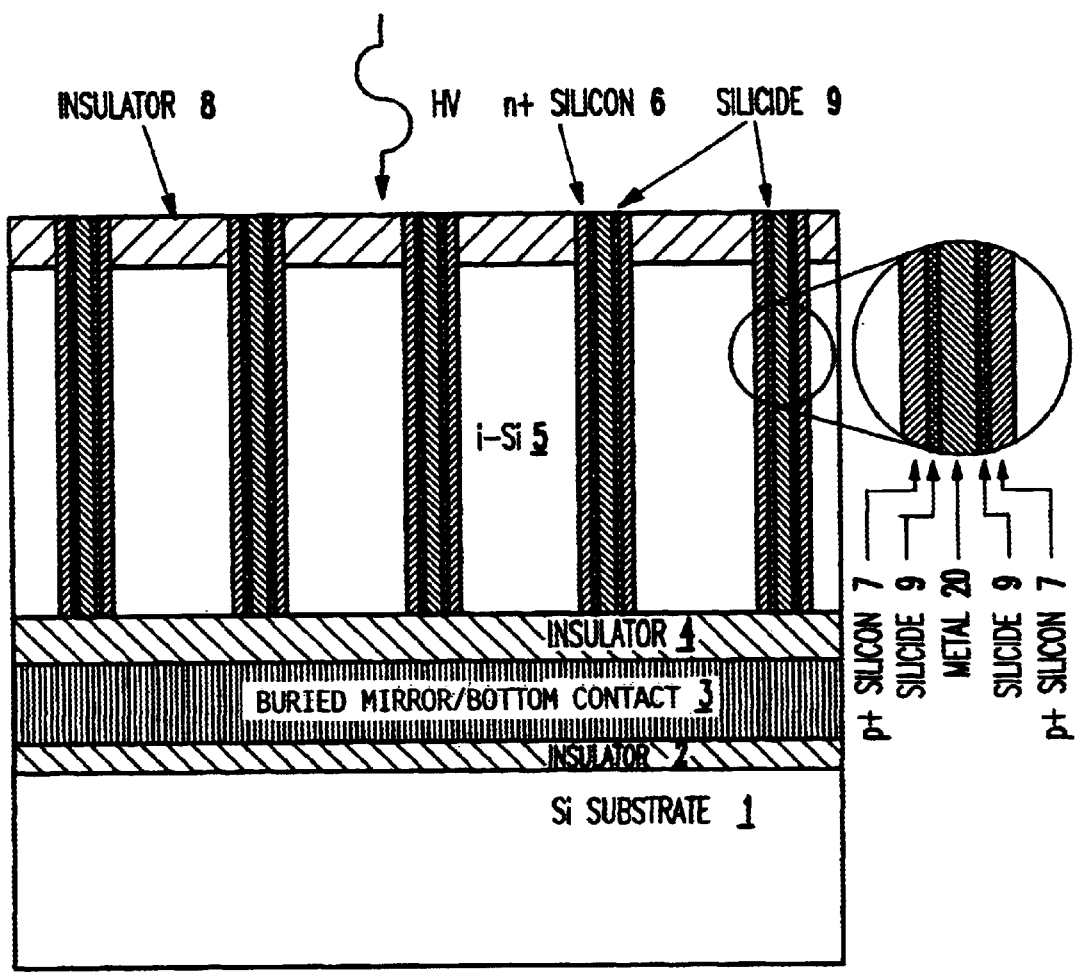
FIG. 3C illustrates a SOI trench detector with silicided trench walls, metal plugs filling the trenches, and a buried mirror according to the present invention.
Figure 3D:
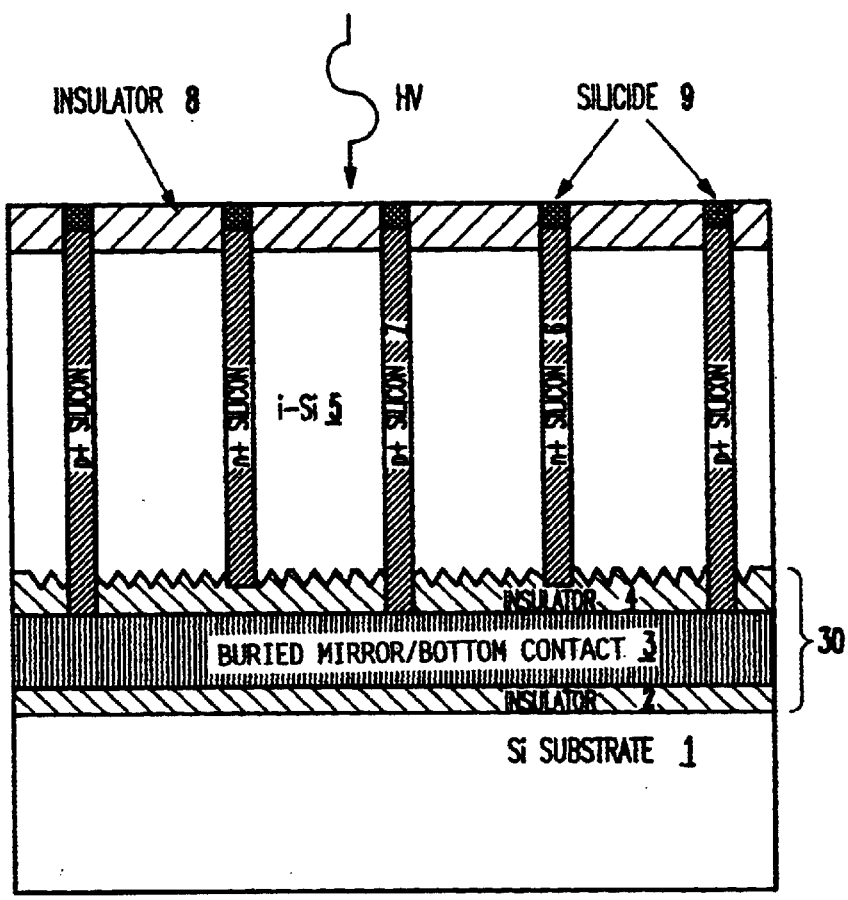
FIG. 3D illustrates a SOI trench detector with a corrugated buried mirror, and a backside contact according to the present invention in which the corrugation is at the SOI—buried mirror interface.

Turning now to FIG. 3D, the present inventors have found that it is desirable to roughen the silicon 5—insulator 4 interface so that the buried mirror 30 (e.g., formed by insulator 4, conductor 3, and insulator 2) is diffusive.

There are several advantages of the diffusive mirror 30 including that a portion of the impinging light would be reflected back into the detector at angles other than perpendicular to the detector surface. Thus, the light's second pass would be longer than the trench depth by $1/\cos(\theta)$, where $\theta$ is the angle by which they diverge from the normal to the surface. If the angle of reflection is large enough, then the light would not escape the silicon film 5 due to total internal reflection.

The configuration of a silicon film 5 on top of a flat mirror will exhibit an etalon effect, such that a destructive interference will result for some wavelengths. Avoiding those dips in the spectrum may be difficult if the silicon film is thick as in the case of the trench detector. The diffusive mirror 30 would alleviate this effect.

Corrugating the photodetector's top surface has been used as a method to increase quantum efficiency. An example of a conventional structure which incorporates a corrugated top surface can be found in the above mentioned U.S. patent application Ser. No. 09/678,315 to Y. H. Kwark et. al, "Silicon-on-insulator trench photodiode structure for improved speed and differential isolation," IBM docket number YOR920000052US1, and to B. F. Levine, J. D. Wynn, F. P. Klemens, and G. Sarusi, "1 Gb/s Si high quantum efficiency monolithically integrable lambda=0.88 $\mu$m detector," Appl. Phys. Lett. 66 (22), p. 2984, (1995), both incorporated herein by reference.

As shown in FIG. 3B (which is similar in concept to the structure of FIG. 3D), it may be desirable to have a planar Si film 5—insulator 4 interface to simplify further processing. In such a case, the advantages of a diffusive mirror could be obtained by roughening the insulator 4—conductor 3 interface, as shown in FIG. 3B. Thus, there is great flexibility in positioning the corrugated mirror in the present invention. It is noted that corrugating the insulator 4 may be more desirable than corrugating the conductor 3 (as in FIG. 3D) in terms of the optics involved (depending upon the dielectric constant). The diffusion of the light will still be substantially the same regardless of whether the insulator or the conductor is corrugated.

In some cases, it would be desirable to avoid having metal films in the wafer during silicon front-end processing. This would require replacing the metallic conductor film 3 with a heavily doped poly-Si. The backside mirror can then be realized by replacing the insulator film 4 with a dielectric mirror which includes a film stack of alternating layers with thicknesses designed to have the maximum reflectivity at the wavelength of operation.

The detector's p and n junction can be realized in different forms. For example, n-type and p-type single crystal silicon fingers can be formed with silicide plugs at the top of the trench. The p-type single crystal junction can be epitaxially grown over the trench walls, using chemical vapor deposition (CVD) of silicon with in-situ doping. Then, the n-type junction is grown in a similar way using a different source of dopants. This approach for forming the p and n junctions by epitaxy has the following advantages.

That is, with epitaxial processing, abrupt junctions can be obtained, and the footprint of the p and n regions is limited only to the trench size. A single crystal silicon in the trench may also be obtained by filling the trench with in-situ doped poly-Si followed by recrystallization of the poly-Si by solid phase growth. The latter method would not achieve a very abrupt junction due to diffusion of the dopant during the re-crystallization anneal.

The detector p and n junction also may be formed by n-type and p-type doped poly-silicon fingers formed with silicide plugs at the top of the trench. The p and n regions are formed by diffusing the dopants into the walls of the trench. The diffusion can be carried out from a gas phase, or a solid source such as boron-doped glass for p-type and phosphorous doped glass for n-type. The doping can also be obtained by diffusing the dopants from the in-situ doped poly-silicon that fills the trench.

The detector p and n junction also may be formed by n-type and p-type doped trench walls 6, 7, silicided trench walls 9, and metal plugs 20 that fill the trench, as shown in FIG. 3C. Due to the silicide and the metal plug, these fingers would have the lowest series resistance. However, in the structure of FIG. 3C, there are more process steps involved in such a fabrication.

Thus, in FIG. 3C, thin layers of silicon (e.g., p-type or n-type) are positioned on each side of the trench, followed by the silicide and the metal plug for conducting the current, thereby to minimize the resistivity and without having to use the conductor 3 as a second contact. It is noted that a corrugated mirror could be used with great benefit in this structure.

For further clarity, FIG. 4 illustrates a layout (top view) of the SOI trench detectors of FIGS. 3A–3B and 3D according to the present invention.

Third Embodiment

Figure 5:
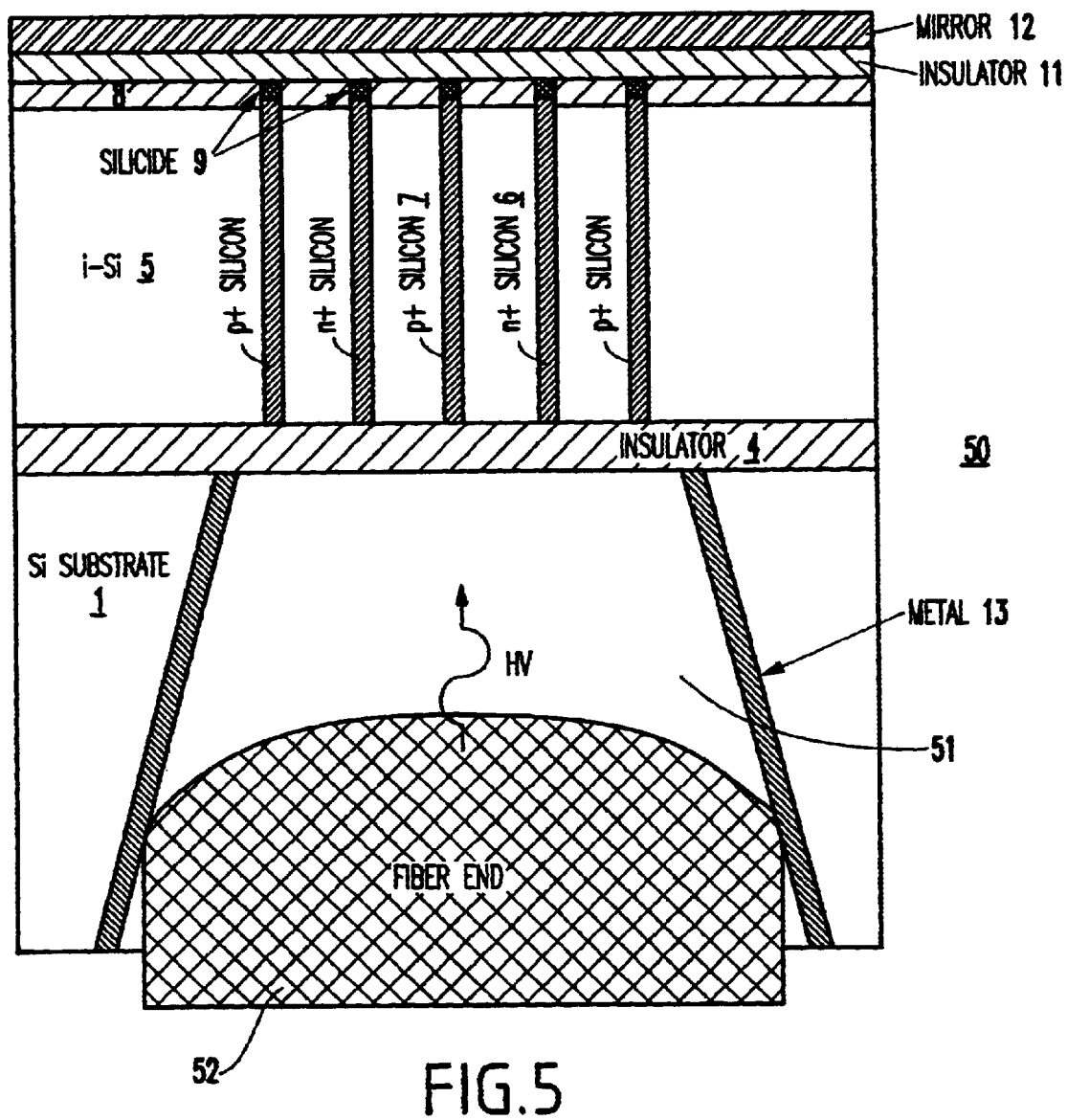
FIG. 5 illustrates a SOI trench detector, with a fiber guide via 51 for backside illumination, and a topside mirror 12 according to the present invention.

FIG. 5 illustrates a cross-section of another trench photodetector 50 embodiment. Photodetector 50 has the following additional features.

That is, the detector 50 is back-illuminated and thus does not require a backside mirror. Instead, a mirror 12 is fabricated (deposited) on top of the wafer surface, which simplifies the fabrication process, since complex mirror bonding steps can be avoided. Mirror 12 may be a metallic mirror or a dielectric mirror which is formed of a multi-layer stack. Such a stack may be formed, for example, from alternating layers of two materials having very different indices of refraction (e.g., polysilicon and oxide, or a nitride and an oxide). The thickness of such layers should be carefully selected since the mirror (unlike a conductor mirror which operates for almost any wavelength) should be tailored to the wavelength of operation.

For example, as shown in FIG. 9, the dielectric mirror can be tailored to be very reflective at 850 nm (which is one of the widely used wavelengths in optical communications). Thus, the mirror can be tuned. The alternating layers provide for reflection since there is a difference in the index of refraction between the layers. Each time an interface is reached between the layers, some light is reflected back. Hence, the thicknesses of the layers can be tailored such that all of the reflected light can be made to be in phase (e.g., sum up) with one another. Hence, if there is a sufficient quantity of layers, then one can reach almost 100% reflection.

Returning to FIG. 5, a socket (e.g., via) 51 for guiding a fiber tip 52 is etched from the back, which leads to a more efficient light coupling and an easier alignment of the fiber 52 to the detector 50. The socket (via) is etched in the silicon substrate 1 beneath the detector.

The structure of FIG. 5 includes a silicon substrate 1, a first insulator layer 4 such as oxide, an intrinsic silicon-on-insulator layer 5, a second insulator film 8, and alternating n-type 6 and p-type 7 filled trenches. The via is formed so as to align the fiber, thereby solving a very important packaging concern.

The fiber socket 51 is coated with metal 13 or a reflective coating which serves to guide the light into the detector region. The contact to the n-type and p-type trenches are made on the top surface. Since back illumination is used, thick and wide metal lines can be used to contact each of the detector fingers 6, 7. The metal line can be extended to completely overlap the silicide 9. A thick insulator film 11 isolates the first metallization lines from the top mirror 12.

Figure 6:
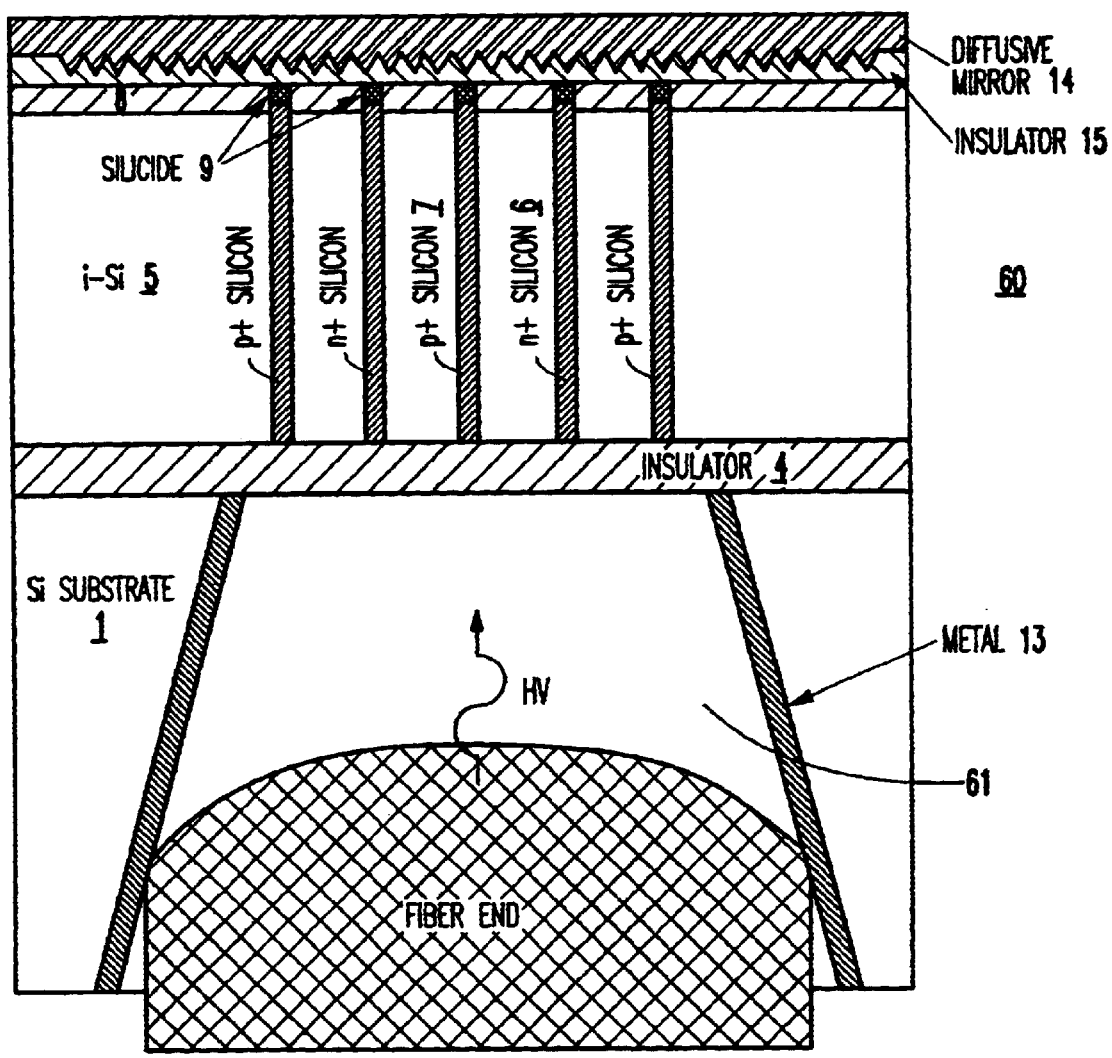
FIG. 6 illustrates a SOI trench detector, with a fiber guide via 61 for backside illumination, and a corrugated topside mirror 14.

Again from similar considerations as described above, a diffusive mirror is advantageous over a plain flat mirror. FIG. 6 illustrates a structure 60, similar to that of FIG. 5, but including such a diffusive mirror 14 on the top surface of the detector. Again, the structures of FIGS. 5 and 6 are very easily fabricated, as opposed to the structures of FIGS. 3A–3D.

It is noted that the metal lines that contact the trenches may be used to build a corrugated mirror. This concept works best when the spacing between trenches is comparable to the wavelength of the radiation. Moreover, it does not require the additional roughening step of the mirror 12. To avoid parasitic capacitance, the spacing between the metal lines should not be too small. However, one disadvantage of this method is that in most cases a periodic corrugation pattern would form due to the fingers being periodically layout. This may cause the mirror to be sensitive to polarization and cause a grating effect.

The Method of the Invention

Turning now to the method of the invention, the major processing steps involved in the fabrication of the structure shown in FIG. 3B are described hereinbelow with reference to FIGS. 7A–7K.

Figure 7A:
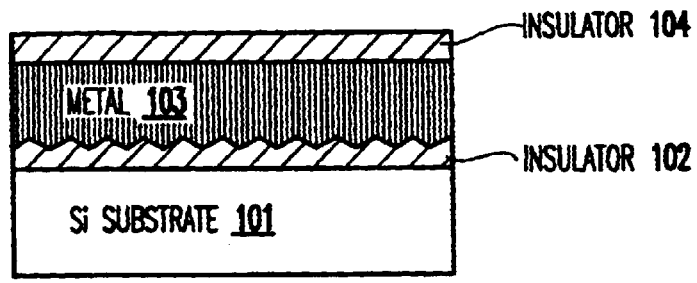

(Step 1) First, as shown in FIG. 7A, a film of an insulator such as nitride or $SiO_2$ 102 is deposited over an intrinsic silicon substrate 101. To make this process robust, it may be desirable to choose an insulator 102 which is etch-resistant to the trench fillers 110 etching as discussed below.

(Step 2) The insulator 102 surface is processed to form a corrugated surface. For example, the corrugation can be achieved by depositing photoresist film, patterning the photoresist film by conventional lithography, and transferring the pattern to the insulator by etching. The photoresist mask is stripped after the etch.

Another method for patterning could be employed which includes spinning a colloidal mixture (e.g., a mixture in which fine particles are suspended in a fluid where they are supported by buoyancy), having particles with roughly the size of the features that are to be formed on the insulator surface. After drying, the surface is covered with particles that would serve as a mask for etching the insulator. The etch can be carried out by reactive ion etching (RIE). Following the RIE, the particles are rinsed or dissolved in a solution.

If roughening at the SOI 5—insulator 4 interface is required, as illustrated in FIG. 3D, then the silicon substrate 101 surface is roughened prior to the deposition of the insulator 102. Corrugation of the silicon 101 surface can be achieved by the methods discussed earlier for roughening the insulator film 102. Alternatively, anisotropic etching of silicon can be used to form self-terminating pits on the silicon surface (e.g., see E. Chen et al., "High-efficiency and high-speed silicon metal-semiconductor-metal photodetector operating in the infrared," Appl. Phys. Lett., 70(6), p. 753, (1997), incorporated herein by reference).

The corrugated surface should not form a periodic structure such as a grating structure. A periodic corrugation would lead to losses due polarization and to light grating effects. While the method of the above-mentioned Chen et al. article forms a two-dimensional periodic lattice of pits, the use of a spin-colloidal mixture yields a random coverage of the surface. The randomness can be further enhanced by using a mixture with different particle sizes.

(Step 3) A conductor 103 such as tungsten is deposited over the insulator 102. Following the deposition, the conductor is planarized, for example, by a method such as chemical mechanical polishing (CMP). This conductor film 103 is used as a back mirror and a back contact. For those cases where a back contact is not used, the metal conductor 103 may be replaced by a dielectric stack (e.g., dielectric mirror) that operates as a reflector. An exemplary dielectric mirror may include alternating films of $SiO_2$ and poly-Si, or $SiO_2$ and aluminum oxide, or $SiO_2$ and silicon nitride.

(Step 4) An insulator film 104 such as $SiO_2$ is deposited over the conductor 103, as illustrated in FIG. 7A. It is sometimes desirable to planarize the surface by polishing the insulator rather than planarizing the metal. The important thing is to have a flat surface on the top. In this case, there is no need to polish the metal (see the previous step above), and the insulator can be deposited directly onto the metal. The planarization of the structure is achieved by polishing the insulator.

Figure 7B:
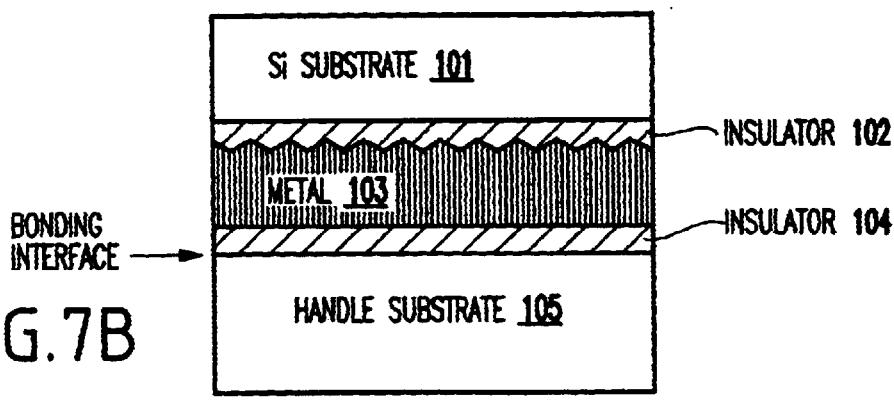

(Step 5) Then, the substrate 101 is flipped over and bonded to a handle wafer 105. Then, the structure is annealed to strengthen the bond between the handle wafer and the insulator 104 film. FIG. 7B shows the structure following the bonding.

Figure 7C:
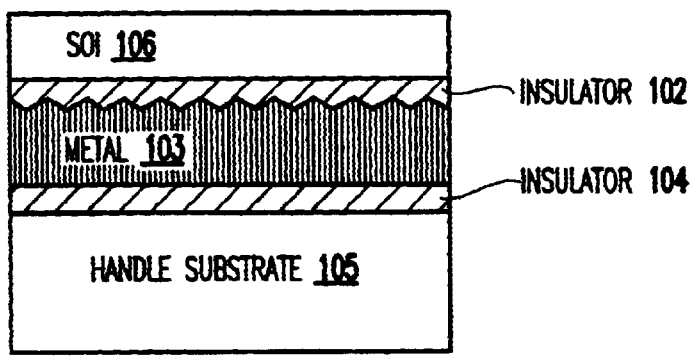

(Step 6) The substrate 101 is thinned down by, for example, grinding and polishing to a desired thickness. The remaining silicon film is referred to as SOI 106, as shown in FIG. 7C. FIG. 7C shows the structure after the substrate 101 is thinned to the desired thickness.

Alternatively to grinding and polishing, a method such as "SmartCut" (e.g., as disclosed in Jean-Pierre Colinge, Silicon-On-Insulator Technology: Materials to VLSI, 2nd Edition, p. 50, Kluwer Academic Publishers, (1997), incorporated herein by reference) can be used to generate the SOI film. In this case, the substrate 101 is implanted with hydrogen prior to the corrugation of the insulator film. The projection range of the hydrogen implant would determine the thickness of the silicon film that would be transferred to the handle wafer.

During the bonding anneal, the implanted wafer 101 is split into two parts including a thin silicon layer, the SOI 106, that remains bonded to the handle wafer and the remainder of substrate 101. The splitting occurs due to blistering caused by the implanted hydrogen. Since only thin silicon layers can be transferred using the "SmartCut" technique, the SOI may need to be thickened to the desired thickness by epitaxy.

Steps 7 to 17 described below are aimed at forming the detector n-type and p-type fingers. These steps were discussed in detail in U.S. patent application Ser. No. 09/784, 963 to M. Yang et. al, "Methods for forming lateral trench optical detectors," having IBM docket number YOR920000839US1, incorporated herein by reference), and are repeated here with the variation required by the disclosed structure.

(Step 7) An insulator film 107 such as $SiO_2$ is deposited over the SOI 106.

Figure 7D:
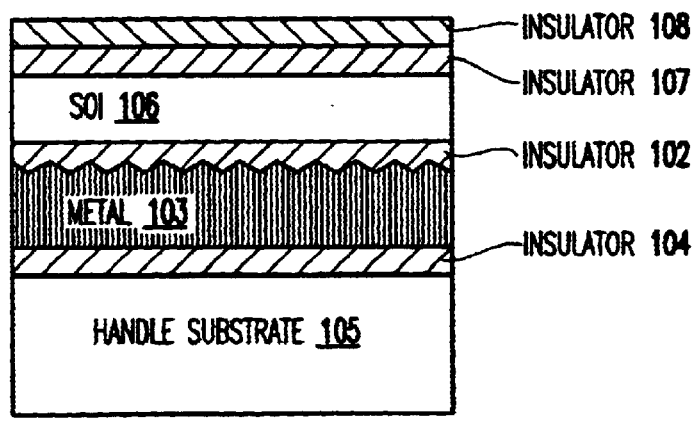

(Step 8) An insulator film 108, such as nitride, is deposited over the insulator 107, as illustrated in FIG. 7D.

Figure 7E:
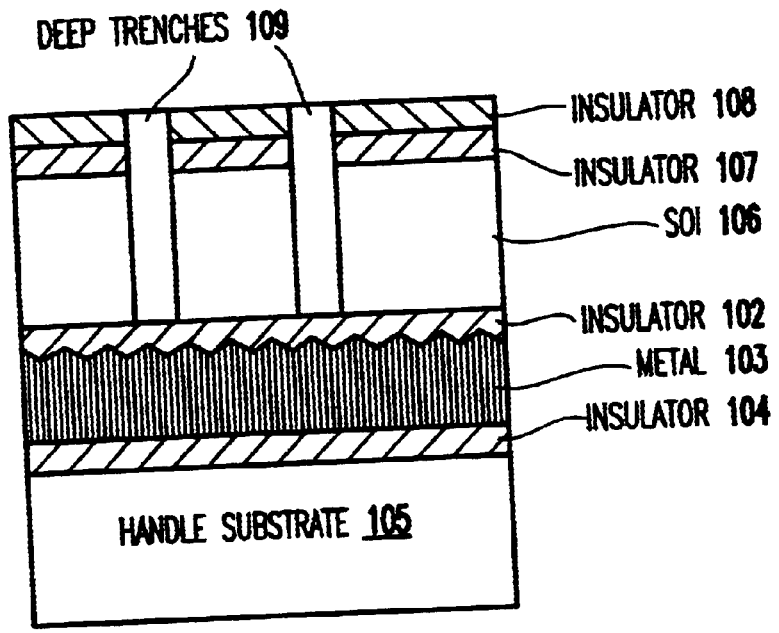

(Step 9) Deep trenches 109 are etched through the insulator layers 107 and 108, with the SOI 106 film stopping on the buried insulator 102. Typically, the etch includes the following steps: hard mask open, in which the insulator layers 107 and 108 are patterned using a photoresist mask, stripping of the photoresist mask, and etching the trenches into silicon using a selective silicon etch which stops on the buried insulator layer 102. The etch is usually carried out by reactive ion etching (RIE). The deep trenches can also be formed by using a <110> oriented Si substrate and anisotropic wet etchant such as KOH. The structure following the etch is illustrated in FIG. 7E.

Figure 7F:
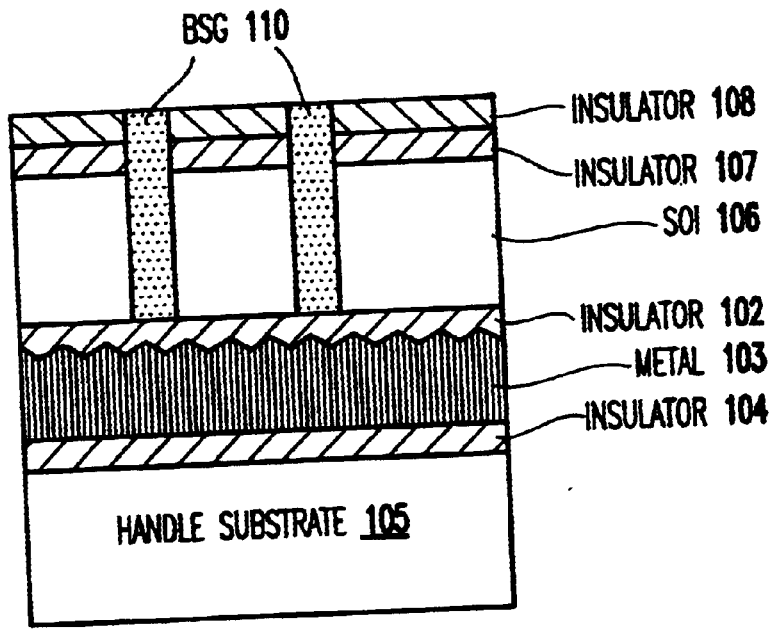

(Step 10) The trenches are filled with a sacrificial material 110. The sacrificial material 110 is also used as a dopant source. For example, borosilicate glass (BSG) is used as a boron source for p-type doping, and phosphosilicate glass (PSG) can be used for phosphorous source for n-type doping. In those embodiments where the p-type trenches connect to the buried conductor 103, the trenches are filled at this step with the p-type source. For other embodiments, the filler can be a n-type or a p-type source. The excess filler material 110 is polished by CMP, where the insulator layer 108 is used as a stop layer for CMP. The structure following the CMP step is shown in FIG. 7F.

(Step 11) Alternating trenches are masked with a material such as amorphous Si 111.

Figure 7G:
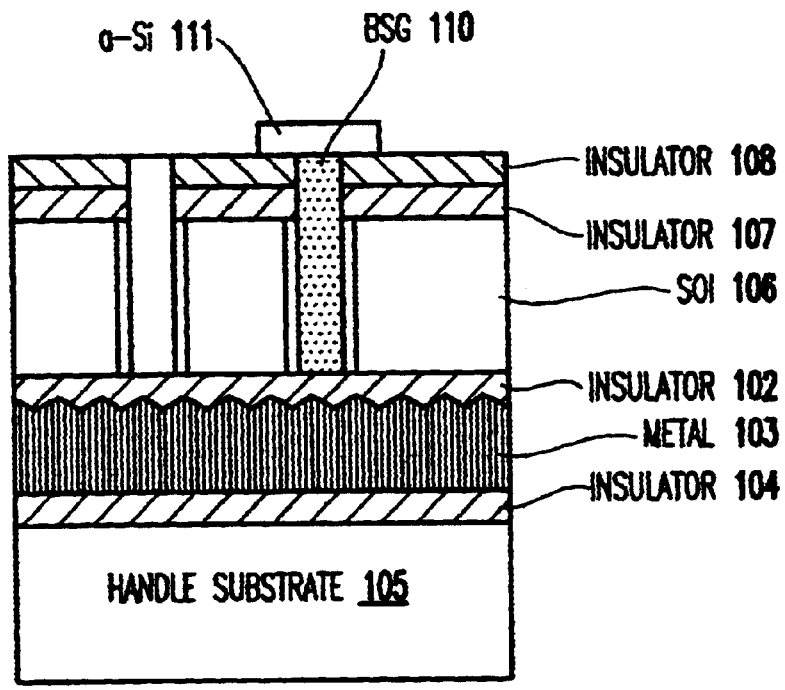

(Step 12) Then, the filler 110 in the unmasked trenches is etched out. The structure following the filler etch is illustrated in FIG. 7G. To make this process robust, it may be desirable to choose an insulator 102 such that the trench filler 110 etch would be selective to the insulator 102. For example, if nitride is used for the insulator material 102, then the BSG or PSG filler, can be etched by hydrofluoric acid (HF) selectively.

Figure 7H:
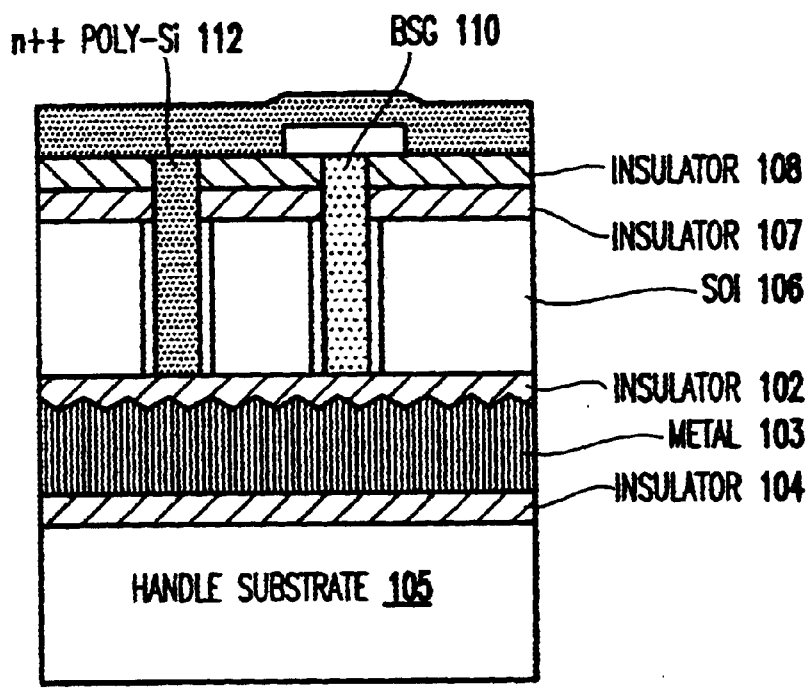

(Step 13) Then, the open trenches are filled with in-situ doped ploy-Si 112. If a n-type source such as PSG was used to fill the trenches earlier in step 10, then a p-type poly-Si is used to fill the open trenches. If the filler 110 is a p-type source, such as BSG, then an n-type poly-Si is used to fill the trench. The structure following the in-situ doped poly-Si deposition is illustrated in FIG. 7H.

(Step 14) The excess poly-Si material 112 is polished by CMP, where the insulator layer 108 is used as a stop layer for CMP. The mask 111 is also polished.

Figure 7I:
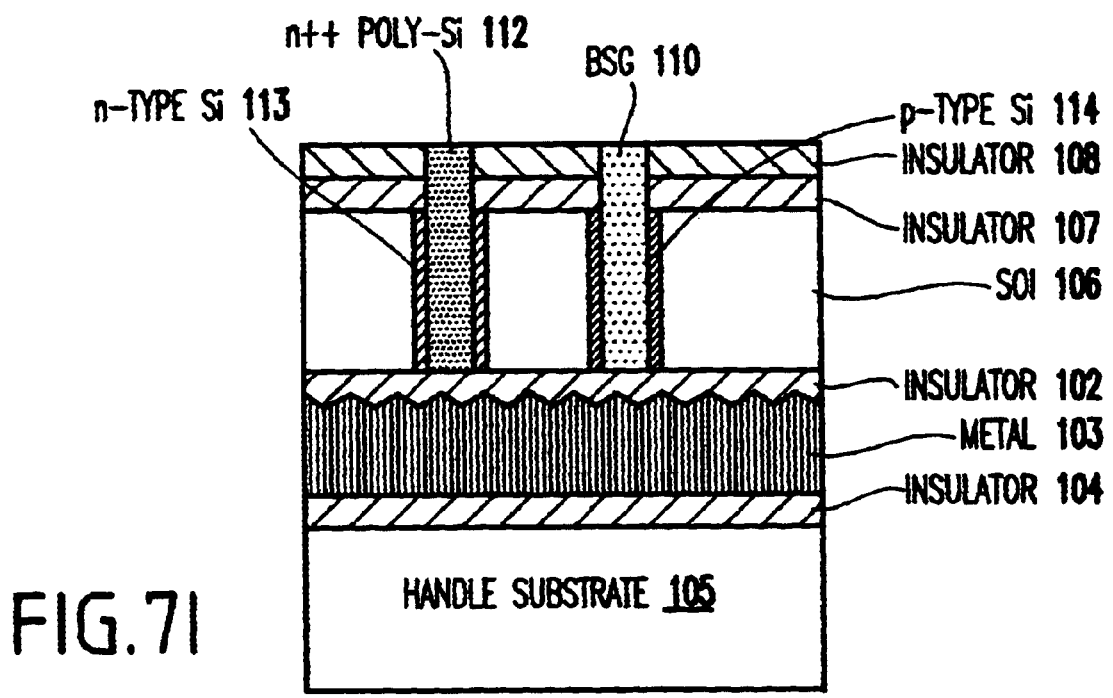

(Step 15) Then, the structure is annealed to drive out the p-type dopant or the n-type dopant from the glass source 110 into the trench walls. For example, a BSG filler would diffuse boron into the trench walls, and a PSG filler would diffuse phosphorus into the trench wall. The anneal also drives out the dopant contained in the in-situ doped poly-Si 112 into the walls of the trench. The dopant diffusion forms doped silicon regions, 113 and 114, in the trench walls that function as the 'p' and 'n' regions of the p-i-n detector. The structure following the diffusion anneal is illustrated in FIG. 7I.

(Step 16) Following the anneal, the filler 110 is etched out. The insulator 102 at the bottom of the trench is also etched out for those embodiments where the p-type trenches would make contact to the buried conductor 103. The open trenches are filled with in-situ doped poly-Si 115. The in-situ doping type is opposite to that used with the previously poly-Si 112 filled trenches. An additional RTA anneal may be required to fully activate the dopants in the trench.

Figure 7J:
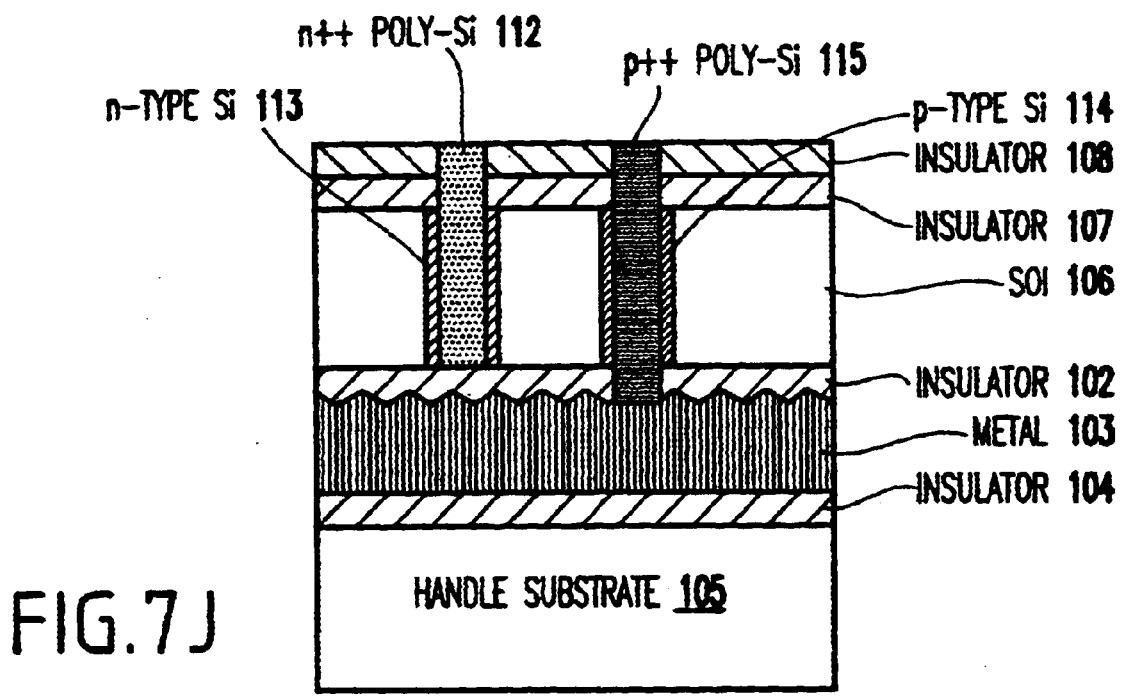

(Step 17) The excess poly-Si material 115 is polished by CMP, where the insulator layer 108 is used as a stop layer for CMP. The structure following the CMP of the poly-Si 115 is illustrated in FIG. 7J.

Figure 7K:
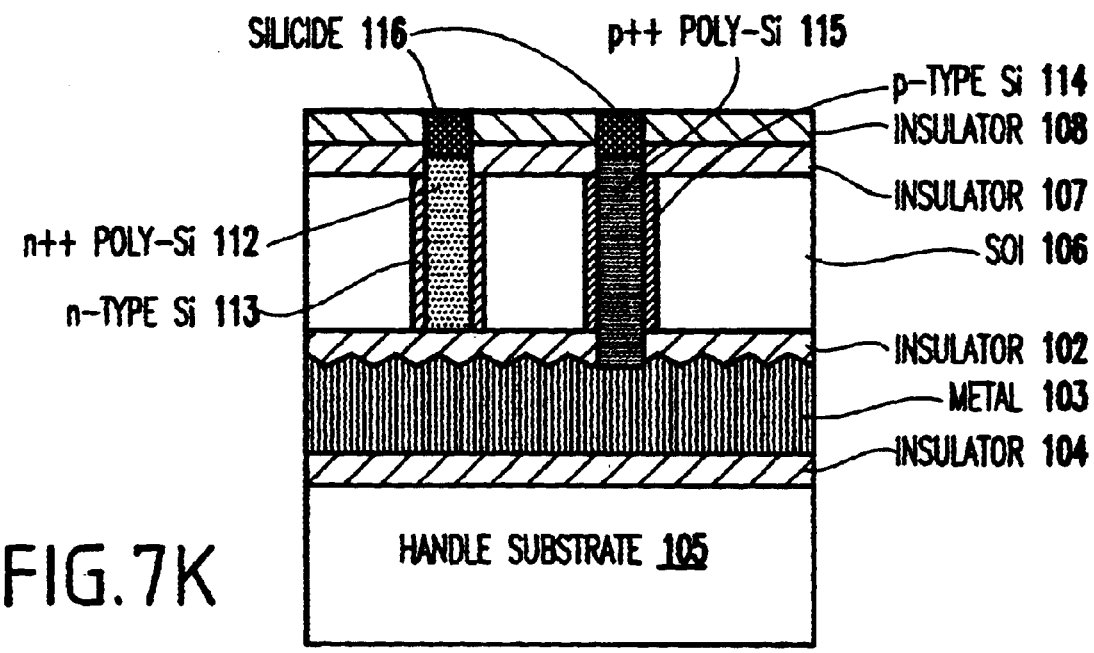

(Step 18) Next, a self-aligned silicide (salicide) process is applied to the structure. The process converts the top portion of each filled trench into a low resistance silicide. A metal such as cobalt is deposited over the structure. The structure is annealed at a first temperature to form the mono-silicide phase (e.g., CoSi). The unreacted metal over the insulator region 108 is selectively etched. Then, a second anneal is applied to form the disilicide phase which is the lower resistivity phase 116 (e.g., $CoSi_2$). For some metals such as Ni, the first monosilicide phase (NiSi) is the lowest resistivity phase. In these cases, the second anneal is not carried out. FIG. 7K illustrates the structure following the silicidation of the top portion of the filled trench.

(Step 14) Then, standard back end of the line (BEOL) processing is applied to the structure for passivation and metallization.

It is noted that diffusion of the dopants from the doped glass or a doped poly-Si may not yield an abrupt p-i-n junction. A slowly varying dopant profiles reduces the electric field near the 'p' and 'n' regions and leads to slow detector response. To obtain an abrupt dopant profile, the 'p' and 'n' junctions may be fabricated by in-situ doped silicon epitaxy. The epitaxy can also be used to fill the trench with doped silicon.

The processing steps required for the fabrication of the structure shown in FIGS. 3A and 3C are similar to the ones outlined in steps 1 to 19 above. Although not shown in FIG. 3C, the structure may incorporate a corrugated mirror. Processing steps 1–12 are kept the same for the structure shown in FIG. 3C, but with the addition of a corrugated mirror. The modified steps 13–17 (noted as steps 13'–17' below and shown in FIGS. 8A–8D, which are used in lieu of the processing of FIGS. 7H–7K) are listed below.

Figure 8A:
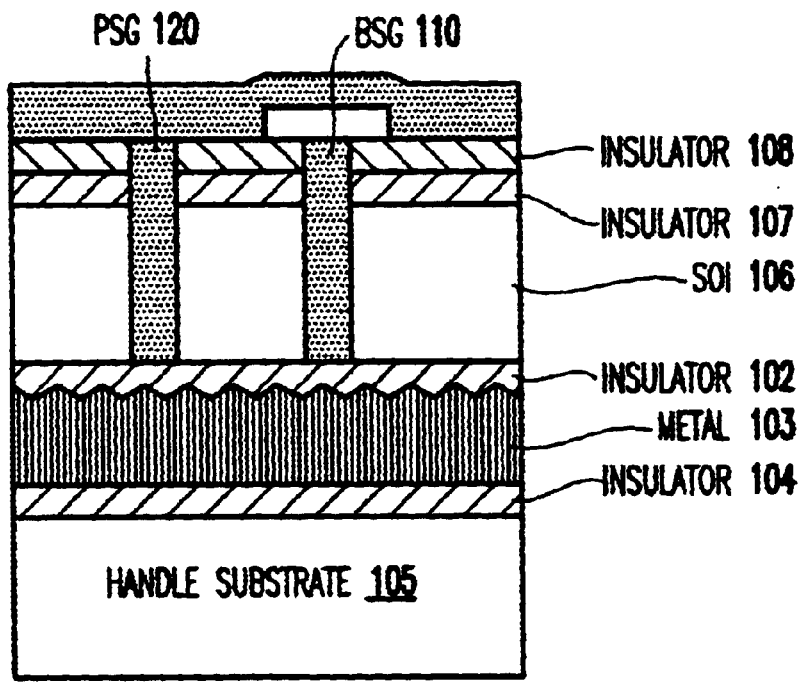

(Step 13') Following the etch of the filler 110 out of the non-masked trenches, the open trenches are refilled with a sacrificial material 120. If an n-type source such as PSG is used to fill the trenches earlier in step 10, then a p-type dopant containing material is used to refill the open trenches. If the filler 110 was a p-type source, such as BSG, then an n-type source such as PSG is used to fill the trench. The structure following the doped glass filler 120 deposition is illustrated in FIG. 8A.

(Step 14') The excess filler 120 is polished by CMP, where the insulator layer 108 is used as a stop layer for CMP. The mask 111 is also polished.

Figure 8B:
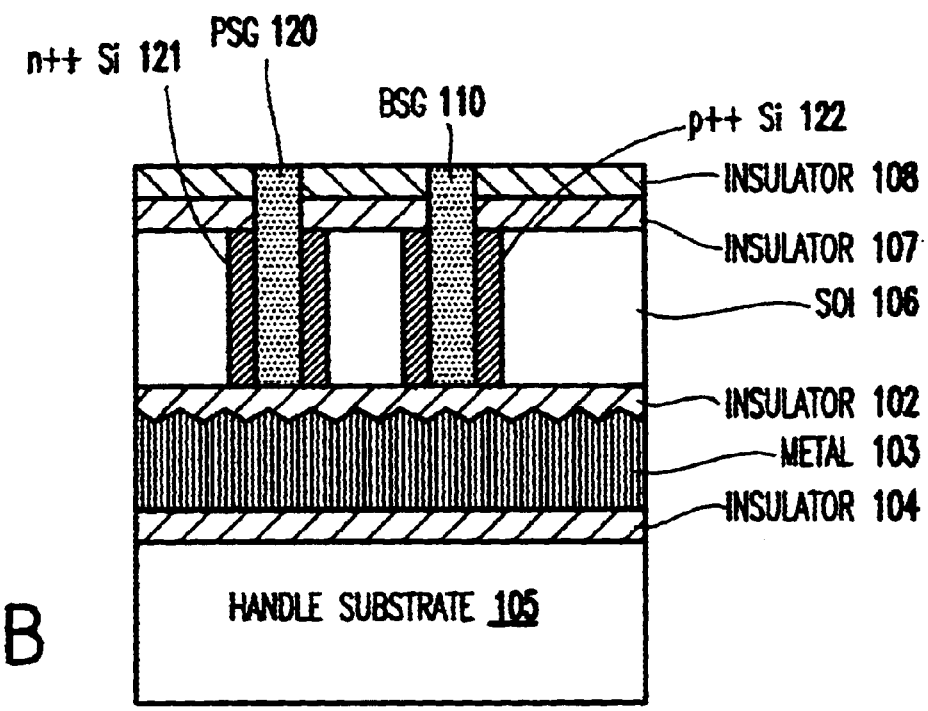

(Step 15') The structure is annealed to drive out the p-type dopant and the n-type dopant from the glass source 110 and 120 into the trench walls. For example, a BSG filler would diffuse boron into the trench walls, and a PSG filler would diffuse phosphorus into the trench wall. The dopant diffusion forms doped silicon regions, 121 and 122, in the trench walls that function as the 'p' and 'n' regions of the p-i-n detector. The structure following the diffusion anneal is illustrated in FIG. 8B.

(Step 16') Following the anneal, the fillers 110 and 120 are etched out.

Figure 8C:
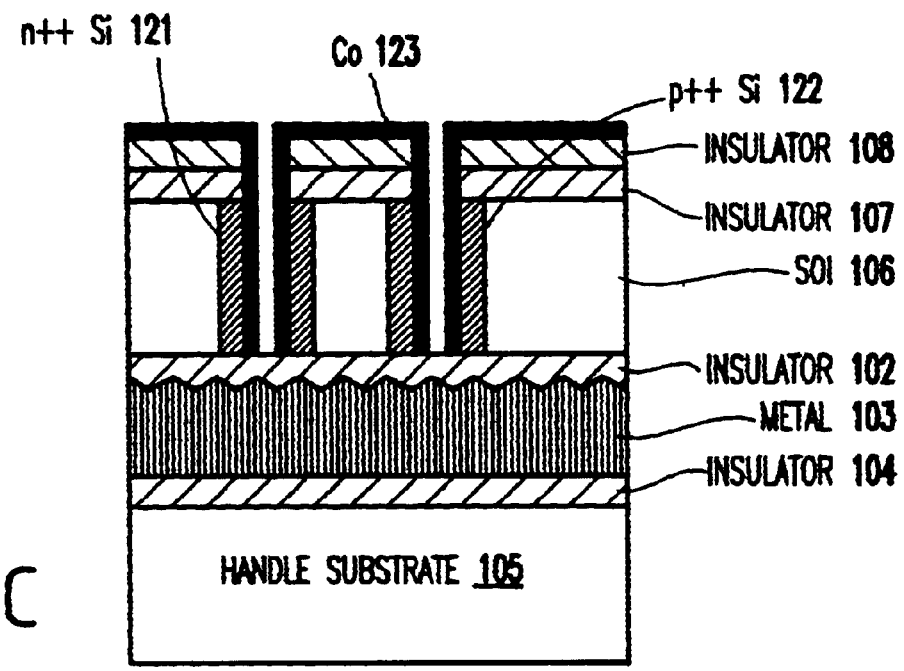

(Step 17') Next, a self-aligned silicide (e.g., "salicide") process is applied to the structure. The process converts the surface of the trench wall into a low resistance silicide, in which a metal 123, such as cobalt or titanium, is deposited conformably over the trench walls and top surface. For example, a metal deposition technique such chemical vapor deposition (CVD) was shown to achieve a full metal coverage of the trench wall, even for trenches with high aspect ratios of 40:1 (e.g., see U.S. patent application Ser. No. 09/929,182, to G. M. Cohen et. al, entitled "A method for increasing the capacitance of a trench capacitor," having IBM docket number YOR920010215US1, and incorporated herein by reference). FIG. 8C illustrates the structure following the metal deposition.

Figure 8D:
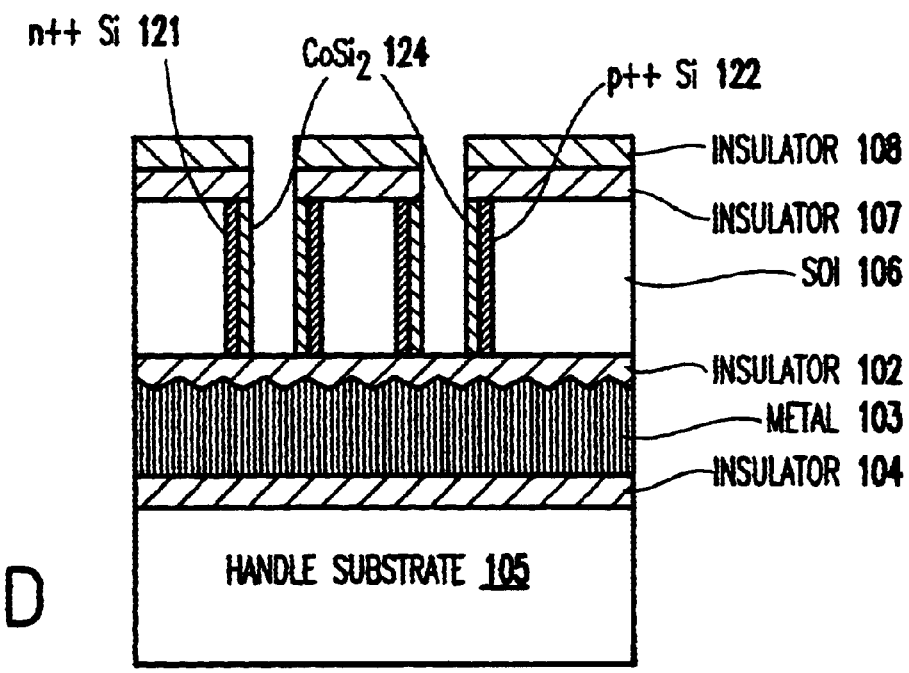

The structure is annealed at a first temperature to form the mono-silicide phase (e.g., CoSi). The unreacted metal over the insulator regions 102, 107 and 108 is selectively etched. Then, a second anneal is applied to form the disilicide phase which is the lower resistivity phase 124 (e.g., $CoSi_2$). For some metals such as Ni, the first monosilicide phase (NiSi) is the lowest resistivity phase. In these cases, the second anneal is not carried out. FIG. 8D illustrates the structure following the silicidation of trench sidewalls.

(Step 18') The trenches are filled with metal plugs. For example, CVD tungsten followed by tungsten CMP is used to form the metal plugs in the trenches.

(Step 19') Then, standard back end of the line processing is applied to the structure for passivation and metallization.

Method of Forming Backside Illuminated Detector

Next, hereinbelow are described the steps required for the fabrication of backside illuminated detector (e.g., as shown in FIGS. 5 and 6).

(Step 1) First, the trench detector is fabricated using steps 7–19 (or 7–12 and 13'–19') as described above. Note that the buried mirror and buried contact are not incorporated in the structure, and thus steps 1–6 are omitted. The starting wafer can therefore be a SOI wafer having a substrate 105, an insulator 102, and a silicon film 106.

(Step 2) A thick layer of an insulator 130 such as $SiO_2$ or nitride is deposited on both sides of the wafer.

(Step 3) Backside lithography is carried out to define an opening in the insulator 130 that overlaps the detector area. Alignment is typically carried out by an infrared (IR) mask aligner, or by a dual microscope (e.g., imaging top and bottom surfaces) mask aligner. In the second case, the image of the top surface is frozen and the alignment of the mask is carried out relatively to the frozen image.

(Step 4) The exposed substrate defined by the openings in the insulator is etched selectively. The etch stops on the buried insulator 4. For example, tetramethylammonium hydroxide (TMAH) can be used to etch selectively Si when an insulator such as $SiO_2$ is used as a hard mask. A dry, deep Si etch such as reactive ion etching, can also be used to etch the via 51.

(Step 5) A metal 12 or 14 is deposited over the front side of the wafer (e.g., the detector side) and patterned to form the top mirror 131 (labeled as 12 in FIG. 5 and 14 in FIG. 6). To fabricate a corrugated mirror, the insulator 130 is roughened prior to the metal deposition. Similar roughening techniques can be used as those discussed above in describing the fabrication of the corrugated buried mirror 103.

Thus, the processing is completed.

Figure 12:
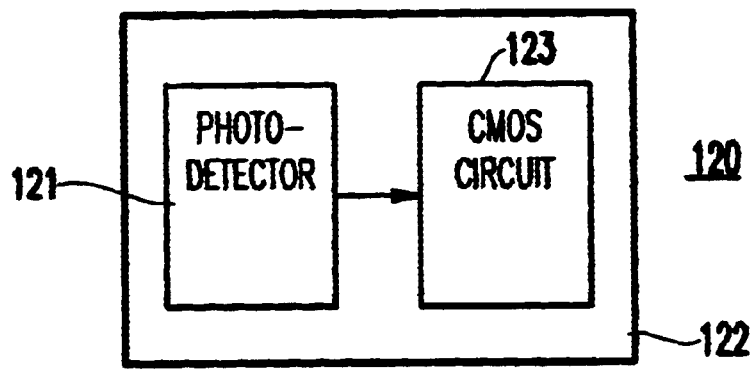
FIG. 12 illustrates the photodetector of the present invention integrated with a complementary metal oxide semiconductor (CMOS) chip.

It is noted that the unique and unobvious detector of the present invention can be integrated with a semiconductor chip. That is, as shown in FIG. 12, a chip 120 includes a photodetector 121 of the present invention can be integrated on a complementary metal oxide semiconductor (CMOS) chip substrate 122. The chip 120 may include a circuit 123 such as, for example, a transimpedance amplifier, or the like for receiving an output of the photodetector 121. The photodetector can also be integrated with a bipolar or a BiCMOS-based chip.

Thus, as described above, the present invention provides a new trench photodiode structure (and method of forming the same) which is applicable to light wavelength communication, and is fully compatible with silicon processing. The structure has a reduced junction capacitance and lower series resistance, exhibits a higher quantum efficiency, and allows an efficient coupling of a fiber. In this last respect and as described above, the invention can be applied to (and would find great benefit with) an optoelectronic device, such as a photodiode, a laser, etc., including a substrate having a via for alignment of a fiber thereto.

While the invention has been described in terms of several preferred embodiments, those skilled in the art will recognize that the invention can be practiced with modification within the spirit and scope of the appended claims.

What is claimed is:

1. A photodetector, comprising:
   a semiconductor substrate;
   a buried insulator formed on said substrate;
   a continuous buried mirror formed on said buried insulator;
   a semiconductor-on-insulator (SOI) layer formed on said buried mirror;
   alternating n-type and p-type doped fingers formed in said semiconductor-on-insulator layer; and
   a backside contact to one of said p-type doped fingers and said n-type doped fingers.

2. The photodetector of claim 1, wherein semiconductor-on-insulator comprises silicon-on-insulator.

3. The photodetector of claim 1, wherein the mirror comprises metal.

4. The photodetector of claim 1, wherein the mirror comprises a dielectric stack.

5. The photodetector of claim 1, wherein the mirror is corrugated.

6. The photodetector of claim 5, wherein the mirror is corrugated at a surface adjacent said buried insulator.

7. The photodetector of claim 1, wherein said fingers include a portion formed of silicide.

8. The photodetector of claim 1, wherein said fingers comprise:
   alternating p-type and n-type doped silicon;
   first and second silicide films respectively formed adjacent said alternating p-type and n-type doped silicon; and
   a metal plug formed adjacent said first and second silicide films.

9. The photodetector of claim 1, further comprising:
   a second buried insulator formed on said mirror.

10. A photodetector, comprising:
    a semiconductor substrate;
    a buried insulator formed on said semiconductor substrate;
    a semiconductor-on-insulator (SOI) layer formed on said substrate;
    alternating n-type and p-type doped fingers formed in said SOI layer;
    a top mirror formed above said SOI layer; and
    a via formed in said semiconductor substrate for backside illumination, and for fiber alignment, wherein light comes from a surface that does not include said top mirror.

11. The photodetector of claim 10, wherein said semiconductor-on-insulator layer comprises a silicon-on-insulator layer.

12. The photodetector of claim 10, wherein the mirror comprises metal.

13. The photodetector of claim 10, wherein the mirror comprises a dielectric stack.

14. The photodetector of claim 10, wherein the mirror is corrugated.

15. The photodetector of claim 10, wherein the mirror is corrugated at a surface adjacent said SOI layer.

16. The photodetector of claim 10, wherein a portion of said fingers is formed of silicide.

17. The photodetector of claim 10, wherein said fingers comprise:
    alternating p-type and n-type doped silicon;
    first and second silicide films respectively formed adjacent said alternating p-type and n-type doped silicon; and
    a metal plug formed adjacent said first and second silicide films.

18. The photodetector of claim 10, wherein said via is coated with a metal.

19. The photodetector of claim 10, wherein said via is for fiber alignment to an optoelectronic device.

20. A photodetector, comprising:
    a substrate;
    a buried insulator formed on said substrate;
    a semiconductor-on-insulator (SOI) layer formed on said substrate;
    alternating n-type and p-type doped fingers formed in said SOI layer; and
    a via formed in said substrate for backside illumination, and for fiber alignment, wherein the via is defined by a set of crystallographic planes.

21. A chip, comprising:
    a chip substrate; and
    a photodetector according to claim 1 formed on said chip substrate.

22. The chip of claim 21, further comprising:
    a circuit, formed on said substrate, for receiving an output from said photodetector.

23. The chip of claim 21, wherein said chip comprises a complementary metal oxide semiconductor (CMOS) chip.

24. The chip of claim 21, wherein said chip comprises a bipolar chip.

25. The chip of claim 21, wherein said chip comprises a BiCMOS chip.

26. An optoelectronic device, comprising:
    a substrate having a via for alignment of a fiber thereto;
    a buried insulator fanned on said substrate;
    a semiconductor-on-insulator (SOI) layer formed on said substrate; and
    alternating n-type and p-type doped fingers fanned in said SOI layer,
    wherein said via is defined by a set of crystallographic planes.

27. The optoelectronic device of claim 26, wherein said crystallographic planes comprise semiconductor 111 planes.

28. The optoelectronic device of claim 26, wherein sidewalls and a shape of the via are nondependent on an etch time of said via.

29. The photodetector of claim 1, wherein said buried mirror also functions as a bottom contact to one of said p-type doped fingers and said n-type doped fingers.

30. The photodetector of claim 1, wherein the buried mirror and the backside contact comprise a same component.

31. The photodetector of claim 1, wherein said buried mirror and said backside contact comprise a single layer.

32. The photodetector of claim 1, wherein said buried insulator isolates the backside contact from the substrate.

33. The photodetector of claim 1, wherein said doped fingers form a lateral p-i-n junction.

34. The photodetector of claim 33, wherein said lateral p-i-n junction is perpendicular to a surface of the substrate.

35. The photodetector of claim 33, wherein said photodiode comprises a lateral p-i-n diode where a p-n junction is perpendicular to an upper surface of the substrate, such that light absorption is decoupled from collection of photogenerated carriers.

36. The photodetector of claim 1, wherein said substrate comprises a single-crystal semiconductor for high-speed optical communications by said photodetector.

37. The photodetector of claim 10, wherein said mirror is corrugated on a single surface.

38. The photodetector of claim 10, wherein said mirror includes a roughened, corrugated surface on a surface furthest from said substrate, and a substantially flat surface on its surface closest to said substrate.

39. The photodetector of claim 10, wherein a surface of said insulator layer is substantially flat.

40. The photodetector of claim 10, wherein said corrugated mirror has an irregular pitch, and a randomness in spacing and shapes of features forming the corrugation.

41. The photodetector of claim 14, wherein said corrugated mirror has a non-periodic structure.

42. The photodetector of claim 10, wherein said mirror comprises a diffusive mirror.

43. The photodetector of claim 10, wherein the doped fingers form a lateral p-i-n junction which is perpendicular to a surface of the substrate.

* * * * *